(12) United States Patent
Patel et al.

(10) Patent No.: US 7,024,573 B2
(45) Date of Patent: Apr. 4, 2006

(54) METHOD AND APPARATUS FOR COOLING HEAT GENERATING COMPONENTS

(75) Inventors: Chandrakant D. Patel, Fremont, CA (US); Cullen E. Bash, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 643 days.

(21) Appl. No.: 10/062,443

(22) Filed: Feb. 5, 2002

(65) Prior Publication Data

US 2003/0147214 A1    Aug. 7, 2003

(51) Int. Cl.
  *G06F 1/26*   (2006.01)
  *H05K 7/20*   (2006.01)
  *F28F 9/26*   (2006.01)

(52) U.S. Cl. .................. 713/324; 361/702; 165/144
(58) Field of Classification Search ................ 713/324; 257/714; 62/259, 81; 361/699, 702, 711, 361/701; 165/144
See application file for complete search history.

(56) References Cited

U.S. PATENT DOCUMENTS

| | | | | |
|---|---|---|---|---|
| 5,144,531 A | * | 9/1992 | Go et al. ...................... | 361/702 |
| 5,467,609 A | | 11/1995 | Feeney ....................... | 62/259.2 |
| 5,509,468 A | * | 4/1996 | Lopez ......................... | 165/144 |
| 5,871,042 A | * | 2/1999 | Gutfeldt et al. ............... | 165/70 |
| 6,026,896 A | * | 2/2000 | Hunter ....................... | 165/206 |
| 6,115,251 A | | 9/2000 | Patel et al. .................. | 361/699 |
| 6,170,270 B1 | | 1/2001 | Arshansky et al. ............ | 62/81 |
| 6,220,955 B1 | * | 4/2001 | Posa ........................... | 454/184 |
| 6,279,337 B1 | | 8/2001 | Davidson et al. ........... | 62/259.2 |
| 6,305,463 B1 | * | 10/2001 | Salmonson ................. | 165/80.3 |
| 6,408,630 B1 | * | 6/2002 | Macias et al. ................. | 62/3.7 |
| 6,603,662 B1 | * | 8/2003 | Ganrot ....................... | 361/698 |
| 6,647,321 B1 | * | 11/2003 | Nagashima et al. ........ | 700/300 |
| 6,828,675 B1 | * | 12/2004 | Memory et al. ............. | 257/714 |

\* cited by examiner

*Primary Examiner*—Thomas Lee
*Assistant Examiner*—Suresh K Suryawanshi
(74) *Attorney, Agent, or Firm*—Richard P. Lange

(57) ABSTRACT

A device and a system for cooling heat generating electronics is disclosed. In one embodiment, the invention is a system for cooling at least one computer component. The system has a plurality of cold plates which are adapted to transfer heat from a plurality of computer components to a cooling fluid. A supply line supplies the cooling fluid to and from these cold plates. The system also has a housing with one or more racks to support the computer component(s). The racks may also support the cold plates so that the cold plates are in thermal communication with at least one computer component.

22 Claims, 8 Drawing Sheets

METHOD AND APPARATUS FOR COOLING HEAT GENERATING COMPONENTS

TECHNICAL FIELD

The present invention relates generally to computer racks and more particularly to methods and apparatus for cooling components in computer racks.

BACKGROUND ART

Industrial data centers have been traditionally designed to accommodate relatively large mainframe computer systems. These systems include stand-alone hinged cabinets containing central processing units, tape guide systems, disk drives, printers, control consoles, and the like. When assembled within a data center, the systems have required a relatively large amount of floor area within a given building, as well as a carefully controlled environment. Control over that environment typically requires a dedicated, sealed computer room which is serviced by corresponding dedicated air-conditioning systems. The residents of these rooms, typically computers with one or more processors, generate substantial heat during their operation. Excess heat is undesirable in this environment, as the processors work more efficiently and with lower failure rates at lowered temperatures. Because of the extensive amount of electrical interconnection required both for power supply and system communication, these computer rooms typically contain raised floors formed of tiles supported upon frames beneath which the complex cable networks can be laid. Generally, the provision of such computer rooms has represented a substantial financial investment on the part of the user. Further, the air distribution through a raised-floor plenum and air conditioning represent a significant investment, and a cooling challenge. Properly cooling these computer rooms, and their delicate residents, has proved one of the greatest challenges for designing and constructing the rooms.

In the recent past, industry has introduced processing systems employing modern, modular electronics and with supporting components permitting their rack mounted installation. Such modularized designs provide for substantial flexibility in accommodating varying processing demands. These racks are configured to accommodate computing components, networking components, and storage components, among others. Today's high compute density data center is characterized as one consisting of thousands of racks each with these networked modular computing units. The computing units include multiple microprocessors, each dissipating approximately 250 W of power. The heat dissipation from a rack containing such computing units typically exceeds 10 KW. Today's data center, with 1000 racks, spread over 30,000 square feet, requires 10 MW of power for the computing infrastructure. Tomorrow's 100,000 square foot data center will require 50 MW of power for the computing infrastructure. Energy required to dissipate this heat will be an additional 20 MW. This adds up to millions of dollars per year to power the cooling infrastructure for the data center.

A typical microprocessor system board contains one or more CPUs (central processing units) with associated cache memory, support chips, and power converters. The system board is typically mounted in a chassis containing mass storage, input/output cards, power supply and cooling hardware. Several such systems, each with maximum power dissipation of up to 300W, are mounted in a rack. The rack used in today's data center is an Electronics Industry Association (EIA) enclosure, 2 meters (78 in) high, 0.61 meter (24 in) wide and 0.76 meter (30 in) deep. A standard 2 meter rack has an available height of 40 U, where U is 44.4 mm (1.75 in). Recent market forces have driven production of 1 U high systems, such as the HEWLETT PACKARD NETSERVER LP1000. Therefore, a rack can accommodate 40 of these systems. If the power dissipation from each system board is 300 W, a single rack in a data center can be assumed to dissipate 12 KW.

The purveyor of computing services, such as an Internet service provider, installs these rack based systems in a data center. In order to maximize the compute density per unit area of the data center, there is tremendous impetus to maximize the number of systems per rack, and the number of racks per data center. If 80 half U systems were accommodated per rack the power dissipation will reach 20 KW per rack for a system board assumed to dissipate 250 W.

With the racks fully loaded, the equipment may, for example, exhibit a significantly high heat load. Moreover, the infrastructure of today must sustain the power dissipation and distribution of tomorrow. The power dissipation from computer components and systems, especially the high power density of microprocessors of the future, will require cooling solutions with unprecedented sophistication. Similarly, the units will call for an uninterrupted power supply load capacity. These requirements, particularly when more than one component of a system is utilized (a typical case) generally cannot be accommodated by the in-place air-conditioning system of a building nor its in-place power capabilities.

The general approach has been a resort to a conventional sealed computer room, an approach which essentially compromises many of the advantages of this modular form of processing system. Such computer room installations further may be called for in locations which are not owned or where the user of the systems otherwise does not have complete control over the power and air-conditioning of the system. A failure or shutdown of the cooling system can lead to computer malfunction, failure, or even permanent damage, having costly consequences for the user. In today's data centers, where air is typically the medium that transfers heat to the distant air conditioning units, large temperature gradients result in expensive cooling inefficiencies. Thus, even when these systems operate as intended, they are largely inefficient.

SUMMARY

In one embodiment, the invention is a system for cooling at least one computer component. The system has a plurality of cold plates which are adapted to transfer heat from a plurality of computer components to a cooling fluid. A supply line supplies the cooling fluid to and from these cold plates. The system also has a housing with one or more racks to support the computer component(s). The racks may also support the cold plates so that the cold plates are in thermal communication with at least one computer component.

In another embodiment, the invention is another system for cooling at least one computer component. This system has a means for holding a plurality of computer boards. The computer boards may connect to electronic connections that provide electrical power to the computer boards, and communications connections that provide communication between the computer boards and an apparatus external to the system. The system also includes a plurality of cold plates, each of which is adapted to serve as a heat exchanger for one or more components on one or more computer boards as well as means for holding one or more of the cold plates in thermal communication with one or more of the computer boards.

In yet another embodiment of the present invention, a method is provided for cooling at least one computer component in a system for cooling comprising at least one cold plate adapted to transfer heat from at least one computer component to a fluid, and a supply line to supply a fluid to and from a heat exchanger. In one embodiment, the method includes the step of providing a housing to store and protect the components of the system. The computer components may be removable. The method may also include providing at least one cold plate within the housing to absorb heat from a computer component, wherein the cold plate is configured to allow fluid to pass through the cold plate. The method may also include circulating a fluid within the housing and through the cold plate and then away from the cold plate such that heat is absorbed from the cold plate into the fluid.

Certain features of the present invention will be set forth in part in the description which follows and in part will become apparent to those skilled in the art upon examination of the following or may be appreciated further by practice of the invention.

BRIEF DESCRIPTION OF THE DRAWINGS

Certain features of the present invention will become apparent to those skilled in the art from the following description with reference to the drawings, in which.

DETAILED DESCRIPTION OF PREFERRED EMBODIMENTS

For simplicity and illustrative purposes, the principles of the present invention are described by referring mainly to various exemplary embodiments thereof. Although the preferred embodiments of the invention are particularly disclosed herein, one of ordinary skill in the art will readily recognize that the same principles are equally applicable to, and can be implemented in other systems, and that any such variation would be within such modifications that do not part from the true spirit and scope of the present invention. Before explaining the disclosed embodiments of the present invention in detail, it is to be understood that the invention is not limited in its application to the details of any particular arrangement shown, since the invention is capable of other embodiments. The terminology used herein is for the purpose of description and not of limitation. Finally, with reference to the drawings, like numerals indicate similar parts throughout the several drawings.

Figure 1:
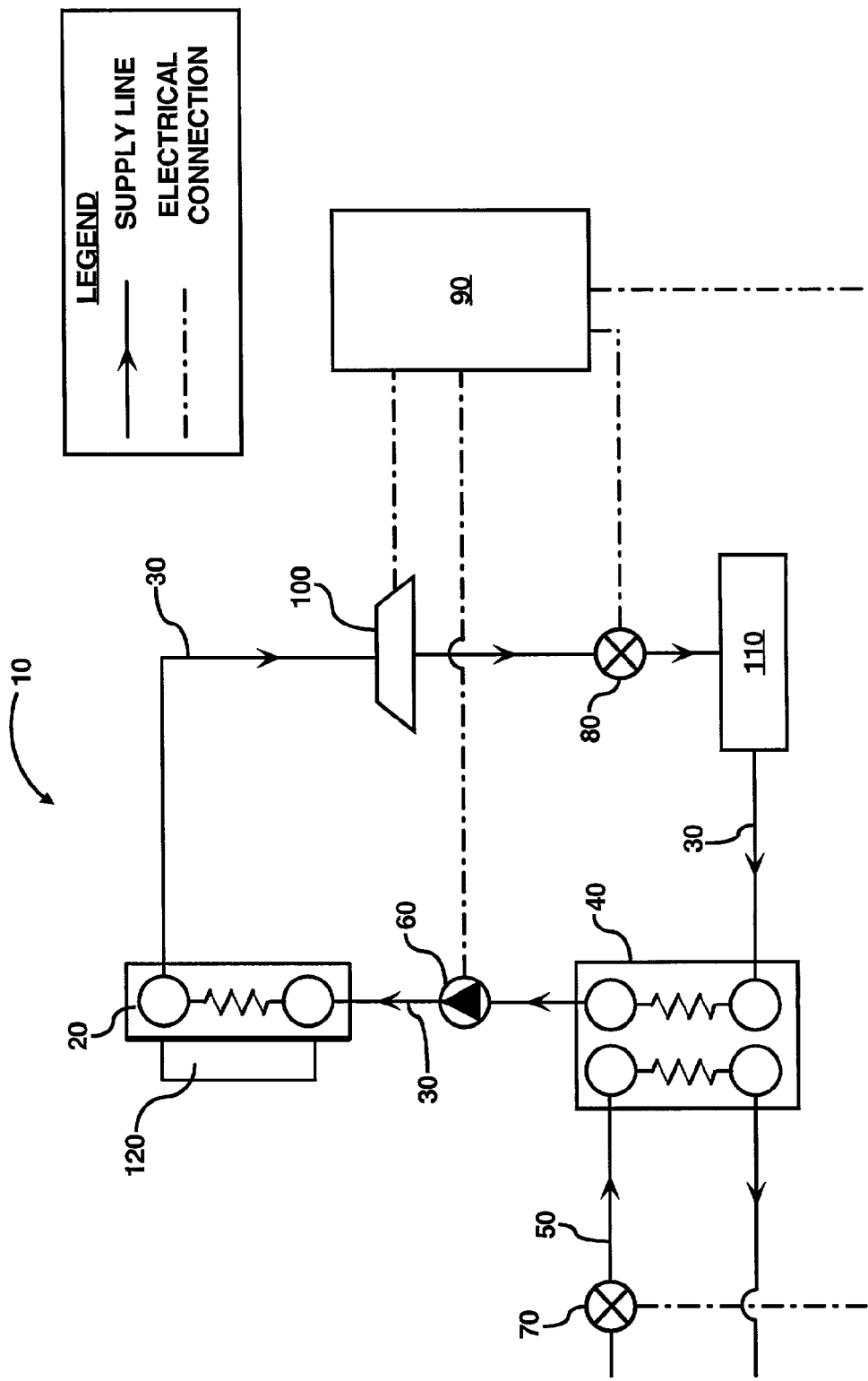
FIG. 1 depicts a schematic view of one embodiment of the invention.

FIG. 1 depicts a schematic view of one embodiment of a cooling system 10. In this embodiment, the cooling system 10 includes a cold plate 20. The cold plate 20 is a liquid heat exchanger such that a liquid circulates through the cold plate 20 and absorbs heat from the cold plate 20. In one embodiment, the liquid is a mixture of ethylene glycol and water, mixed in a predetermined ratio, or some other suitable liquid selected for its heat absorbance and transfer characteristics, and/or its non-corrosive characteristics. The liquid is supplied to the cold plate 20 through a supply line 30 which circulates the liquid through a variety of different cooling system components.

The cooling system 10 includes a second heat exchanger 40 such that liquid circulates through the second heat exchanger 40 and radiates heat to the second heat exchanger 40. Likewise, the second heat exchanger 40 is such that it absorbs heat from the liquid supplied by the supply line 30. This second heat exchanger 40 may transfer heat away from the liquid supplied by the supply line 30 in a wide variety of ways, which generally involve transferring the heat to another medium. This medium may include any state of matter ranging from solids to fluids, including liquids and gases and combinations of these states of matter. Thus, the second heat exchanger 40 may transfer heat directly to a refrigerant, or directly into a large solid body, such as the ground, or make use of a thermosyphon, an evaporative cooler, or the like, as may be appreciated by one skilled in the art.

In one embodiment, the second heat exchanger 40 is a liquid-liquid heat exchanger that includes a chilled water supply 50. The chilled water supply 50 may come from the building in which the cooling system 10 is housed, as is typically used for large air-conditioning applications. A chilled-water air conditioning system (not shown) typically operates by chilling water with a heat exchanger and then piping the chilled water throughout the building to be air conditioned. Various air handler units are employed in the building as necessary to provide adequate cooling for the building. With regard to certain embodiments of the present invention, the chilled water supply 50 may be piped in to the second heat exchanger 40, and thereby used to chill the liquid circulating through the supply line 30. It should be appreciated that the second heat exchanger 40 is not limited to a chilled water supply 50, and may employ any suitable liquid that facilitates use of a liquid to liquid heat exchanger. Alternatively, the second heat exchanger 40 may use any of the variety of known means to cool the liquid in the supply line 30, such as air cooling or evaporation. Thus, the second heat exchanger 40 may make use of a refrigerant system. The chilled water supply 50 may be substituted with any suitable fluid for transferring heat away from the cold plate 20, for instance a coolant or refrigerant, such as ethylene glycol, a mixture of coolant and water, or any other suitable fluid.

The cooling system 10 may include one or more pumps 60 to circulate the liquid through the supply line 30 and other components within the cooling system 10. It should be appreciated that a plurality of pumps 60 may be used, arranged in series and/or parallel depending on the particular requirements of the cooling system 10. These pumps 60 may be configured to operate at variable speeds. This facilitates modulation of the cooling operation of the cooling system 10, since the pumps 60 may be directed to operate at a slower speed when less cooling capacity is required.

The cooling system 10 may include one or more valves 70 and 80. A chilled water supply valve 70 is useful to modulate the flow of chilled water into the second heat exchanger 40.

A supply line valve 80 is useful to modulate the flow of liquid through the supply line 30. Although the cooling system 10 depicted shows only two valves 70 and 80, it should be appreciated that any number of valves 70 and 80 may be employed at various locations in the cooling system 10 to control the flow of liquids in the cooling system 10. Thus, another way to modulate the cooling operation of the cooling system 10 is by operation of the valves 70 and 80, which may be fully opened or closed, or any position there between, i.e., partially open.

In the embodiment depicted in FIG. 1, a controller 90 is provided to control the operation of one or more functions of the cooling system 10. The controller 90 may be a microprocessor control system that controls the actuation of the valves 70 and 80, as well as the pumps 60, to ensure a proper temperature is maintained by the cooling system 10. It is to be noted that, although the cooling system 10 is described as including a microprocessor control system, in one embodiment, manually or otherwise activated valves 70 and 80 and pumps 60 may be provided. Alternatively, a combination of manually or otherwise activated valves 70 and 80 and pumps 60 may be provided.

In the embodiment shown in FIG. 1, the controller 90 is in electronic communication with a temperature gauge 100. The temperature gauge 100 provides information to the controller 90 such that the controller 90 may determine whether to increase or decrease the operation of the cooling system 10, primarily by adjusting restrictions on circulation of liquid through the cooling system 10. While the temperature gauge 100 is depicted as being connected to the supply line 30, it may be connected to another component of the cooling system 10. For instance the temperature gauge 100 may be connected to the cold plate 20, or it may be included within or as part of a liquid reservoir 120. The controller 90 may also be in electronic communication with, and even control the operation of, the valves 70 and 80 and pumps 60 based upon a pre-programmed sequence, without reference to a temperature gauge 100.

In one embodiment, the controller 90 is responsive to and may even anticipate the cooling needs of the cooling system 10. For instance, the controller 90, may modulate the flow of the chilled water supply 50 through the valves 70 and 80. A valve that operates in conjunction with a cooling system as described herein and may operate in response to a signal sent by a device such as a controller 90 or a temperature gauge 100 may be referred to as a smartvalve. Thus the system 10, may utilize a valve 70, or a plurality of valves (not shown) to control the flow of the chilled water supply 50 through the second heat exchanger 40. When the controller 90 determines that the temperature detected by the temperature gauge 100 is below a predetermined threshold, the controller 90 may partially close the valve 70. This may lower the amount of liquid circulating through the second heat exchanger 40, thereby modulating the cooling capacity of the cooling system 10, and, in turn lower the load on the chillers that provide the chilled water supply 50. Alternatively, the controller 90 may modulate the operation of the pumps 60, for instance by slowing them down, or the position of valve 80, for instance by partially opening or closing the valve 80.

A reservoir 110 serves to provide a head for the pump 60. The reservoir 110 may be installed at a higher elevation than the pump 60 so that the pump 60 does not run dry, or otherwise operate with an insufficient amount of liquid.

The cold plate 20 is in thermal communication with both a cooling liquid, supplied by the supply line 30, and one or more computer components 120. The one or more computer components 120 may include one or more processors, microprocessors, network chips, power converters, memory blocks, memory controllers, central processing units, disk drives, power supplies, or a variety of other components.

The cooling system 10 may be supplied with a redundant power backup (not shown), such as a generator, or an alternate power source, such as a separate utility. This redundant power backup may automatically begin working upon failure of a primary power source.

Thus, in its most basic aspects, the present invention provides a system 10 for cooling one or more computer components 120 wherein the cooling functionality is brought directly to the computer components 120. In one embodiment, the rack structure, which may also be referred to as a housing or chassis (not shown), is the data center and separate cooling is not required. Thus, computer boards 120 without their own cooling infrastructures, such as fans and heat sinks, may be used. The system may employ liquid cooling, which permits a processor density that overwhelms the capacity of air cooled units. In one embodiment, the cooling is modulated in accordance with the heat load presented by the microprocessors or computer boards 120. This leads to significant increases in efficiency and overall lowered cooling costs. In one embodiment, the invention allows a user to enrich total cooling conditioning capacities at minimum of expense while facilitating ease of manufacture, increasing capacity, and decreasing total space.

Figure 2:
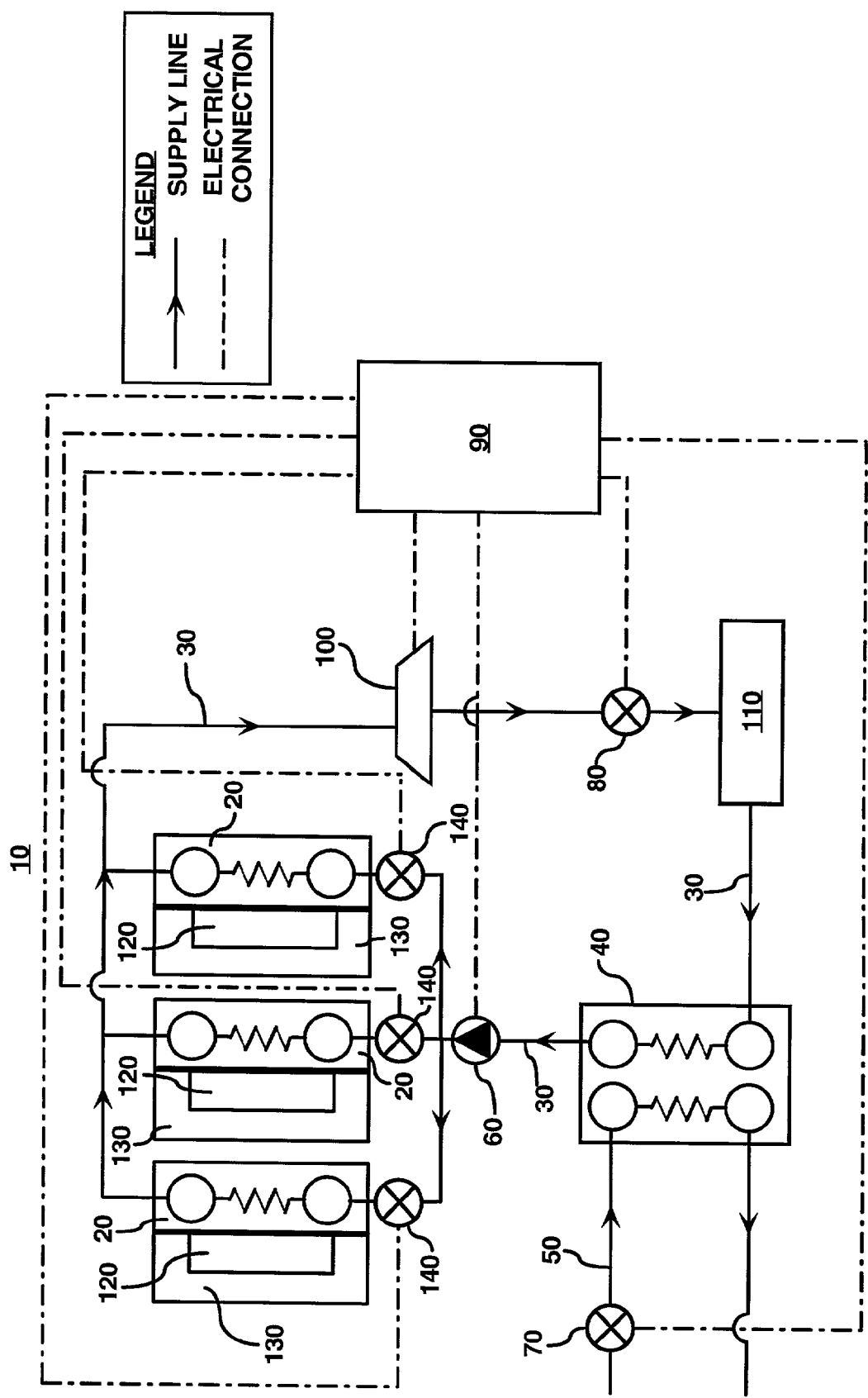
FIG. 2 depicts a schematic view of an embodiment of the invention similar to that depicted in FIG. 1.

FIG. 2 illustrates the cooling system 10 of FIG. 1, as it applies to multiple computer boards 130. Each computer board 130 has its own computer component(s) 120 attached thereto. Each computer board 130 is provided a cold plate 20, that is in thermal communication with one or more of the computer components 120 of the computer board 130. It should be appreciated that a cooling system 10 such as that depicted in FIG. 2, may also operate with computer components 120 that are not attached to a computer board 130, as shown in FIG. 1. Any of these computer components 120 may also be air-cooled, or such a computer component 120 may entirely be air-cooled such that the system 10 utilizes a combination of air-cooling and liquid cooling to cool the computer components 120.

While FIG. 2 depicts the multiple heat exchangers 130 arranged in parallel with regard to the supply line 30, the heat exchangers might otherwise be arranged in series or a combination of series and parallel.

A variety of valves 140 similar to valve 80 may be installed in the supply line 30 so that any of the supply lines serving a particular cold plate 20 may be shut off, while the other cold plates 20 continue to operate. Controller 90 may control the operation of these valves 140. Valves 140 may operate as previously described with respect to valves 70 and 80, in a variety of positions, and they are not limited to being entirely open or closed, but may be partially open, so as to independently or collectively modulate the cooling operation of the cold plates 20.

A redundant chilled water supply (not shown) may also be provided. The redundancy may be provided upstream, i.e., by having a plurality of mechanisms to chill the water supply in a single system.

The controller 90 may be in communication with each computer board 130, such that the controller can predict the total heat load being generated by the system 10 based on an expected heat load for a single computer board. Thus, the controller 90 may determine when less than the total capacity of computer boards 130 are being used, the total cooling of the system 10 may be scaled down. Similarly, the controller 90 may close or partially shut one or more of the valves 140 to scale down the total cooling of the system 10. These operations are referred to herein as "modulating" the heat extraction of the system 10. This will help to conserve costs and reduce the overall energy consumption of the system 10. By modulating the heat extraction of the system, the chiller(s) (not shown) for the chilled water supply 50 will unload, and they may reduce their speed and their cooling operation.

In another embodiment, the controller 90 may be in communication with one or more sensing devices (not shown) for measuring power consumption. Each such sensing device (not shown) may operate within the cooling system 10 to measure the power consumption of one or more computer components 120, or one or more computer boards 130, especially where one or more of the computer boards 130 has multiple computer components 120 embedded thereon. The controller 90 may then modulate the cooling operation of the cooling system 10, in a manner similar to that described with reference to the temperature gauge 100. These sensing devices (not shown) may replace, or act in concert with, the temperature gauge 100.

It should be appreciated that a wide variety of arrangements are possible, especially with respect to the temperature gauge 100, supply line 30, pump 60, valve 80, and sensing device (not shown) and all of these arrangements are within the scope of the various embodiments of the presently contemplated invention. For instance, the components may be arranged differently within a cooling system 10, or a plurality of them might be provided. Thus, a cooling system 10 might include several valves 80 installed along the supply line 30 or upon or within the variety of components within the cooling system 10.

Figure 3:
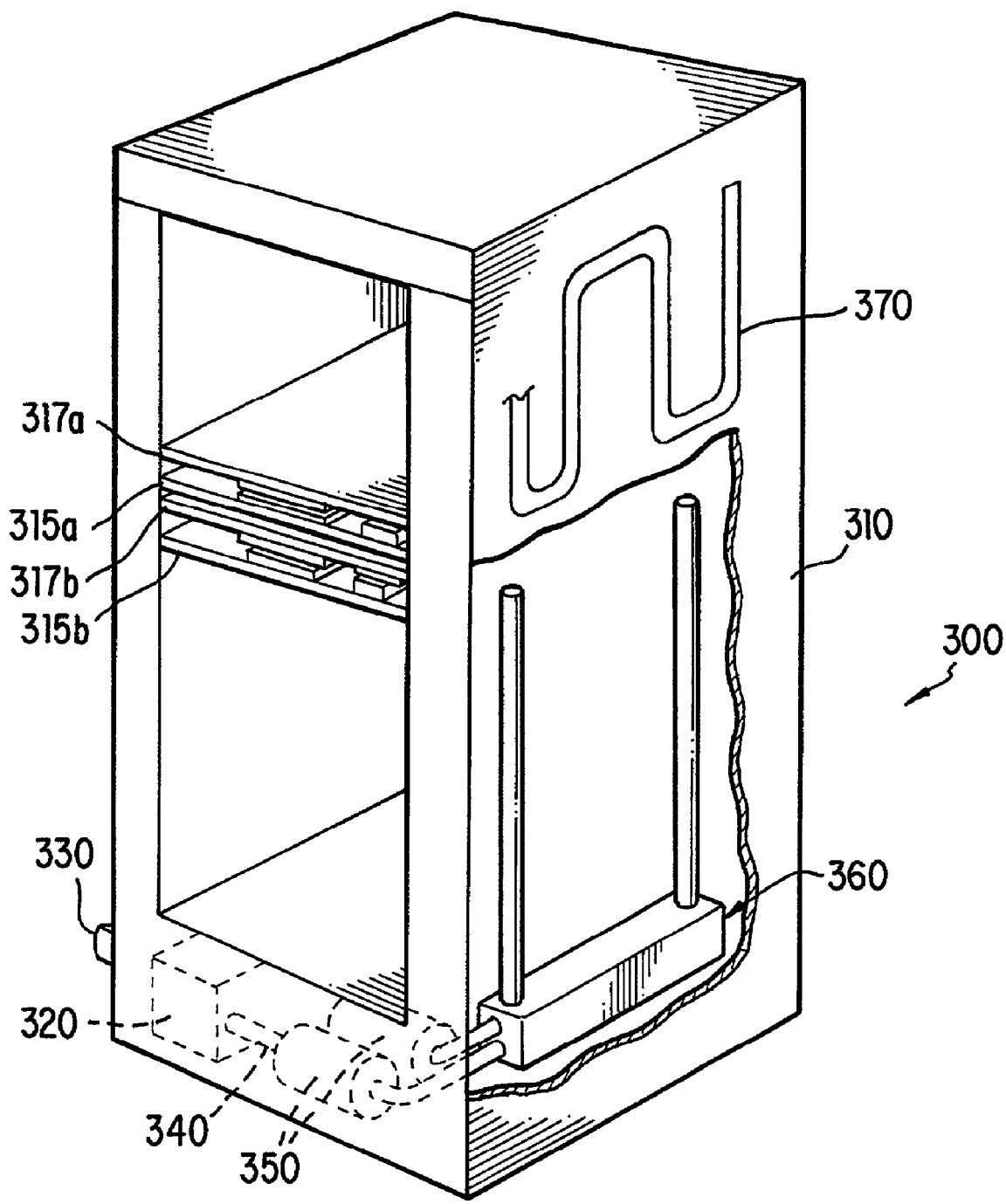
FIG. 3 shows a perspective view of one embodiment of the present invention.

FIG. 3 shows a perspective view of one embodiment of the present invention. In this embodiment, a storage and cooling system 300 for rack-mounted computer boards is provided. A housing 310 serves to house a plurality of rack-mounted computer boards 315*a* and 315*b*. Although only two boards are depicted, it should be appreciated that the storage and cooling system 300 may house many boards. In one embodiment, the storage and cooling system 300 houses over 80 computer boards 315*a* and 315*b*. Each computer board 315*a* and 315*b* is provided at least one actuated cell 317*a* and 317*b*. Each actuated cell 317*a* and 317*b* is configured to provide cooling for the components on one or more computer boards 315*a* and 315*b*.

The storage and cooling system 300 provides cooling for computer boards, as well as electrical connectivity. For purposes of this disclosure, the term "computer board" is intended to refer to the wide variety of such boards, including but not limited to, CPU boards, system boards, printed circuit boards, and the like. The storage and cooling system 300 may provide for economical cooling and storage and operation of all these boards, since the boards would not need to be stored within a separate data center. The storage and cooling system 300 may serve as the data center. In this way, a dedicated, environmentally controlled room is not required, and the storage and cooling system 300 may be installed in a wide variety of locations. Additionally, the storage and cooling system 300 also provides for management of the cooling so as to avoid wasted energy. Thus, the storage and cooling system 300 may include internal monitoring components to ensure that the system does not over or under cool. This may be important given the variety of heat created by the boards within such a system. The heat load of such a cooling system is proportional to the number of boards that are operating to produce heat. For instance, such a system may be only partially utilized when only a few boards are installed, or when one or more of the boards are idle, or otherwise not operating. The storage and cooling system 300 may lower the flow of liquid within the system, for instance using one or more of the valves, or slowing the operation of the pump. Alternatively, the storage and cooling system 300 may lower the cooling of liquid flowing through the system, by modulating the operation of the heat exchanger 320 used to withdraw heat from the liquid flowing through the system. Thus, the heat extraction may be based on the needs of the boards 315*a* and 315*b* being serviced by the storage and cooling system 300, and the capacity of the heat exchanger 40 at any given time should approximate the cooling needs of the system 300.

The embodiment depicted in FIG. 3 includes a liquid to liquid heat exchanger 320 such as that depicted in FIG. 1. This heat exchanger 320 is connected to a chilled water supply 330, and may include a valve (not shown). The valve enables control over the flow of chilled water from the chilled water supply 330 through the heat exchanger 320. The heat exchanger 320 puts the chilled water from the chilled water supply 330 in thermal communication with a liquid in the storage and cooling system 300.

The liquid in the storage and cooling system 300 travels through a supply line 340. In the embodiment shown, the supply line connects the liquid to liquid heat exchanger 320 to a plurality of redundant pumps 350. These pumps 350 are used to push the liquid from a reservoir 360 into the liquid to liquid heat exchanger 320 and out into the system 300. As previously described, the reservoir 360 serves to help ensure that the pumps 350 have sufficient liquid. In this regard, it may be noted that the reservoir 360 is positioned vertically higher than the pumps 350. From the liquid to liquid heat exchanger 320, the liquid travels within the housing 310 to the actuated cells 317*a* and 317*b*. The actuated cells 317*a* and 317*b* transfer heat from the computer boards 315*a* and 315*b* to the liquid traveling through the storage and cooling system 300. The liquid then returns to the reservoir 360, travels through the pumps 350, and then on to the liquid to liquid heat exchanger 320, where the liquid's heat is transferred to the water in the chilled water supply 330.

The housing 310, may be constructed with roll bond sides 370. The roll bond sides serve to further cool the apparatus, as described in U.S. Pat. No. 6,115,251, the teachings of which are incorporated herein by reference. In one embodiment, the roll bond sides 370 are an external panel formed from two sheets bonded together to define a sealed fluid channel there between, such that the liquid traveling through the supply line 340 and into the actuated cells 317*a* and 317*b* may also travel through the roll bond sides 370 and thereby further extract heat from the system 300. In one embodiment, the liquid in the supply line 340 travels directly from the heat exchanger 320 to the actuated cells 317*a* and 317*b* as previously described, and then through the roll bond sides 370. In another embodiment, the liquid in the supply line 340 travels directly from the heat exchanger 320, through the roll bond sides 370, then on to the actuated cells 317*a* and 317*b*, as previously described.

Figure 4:
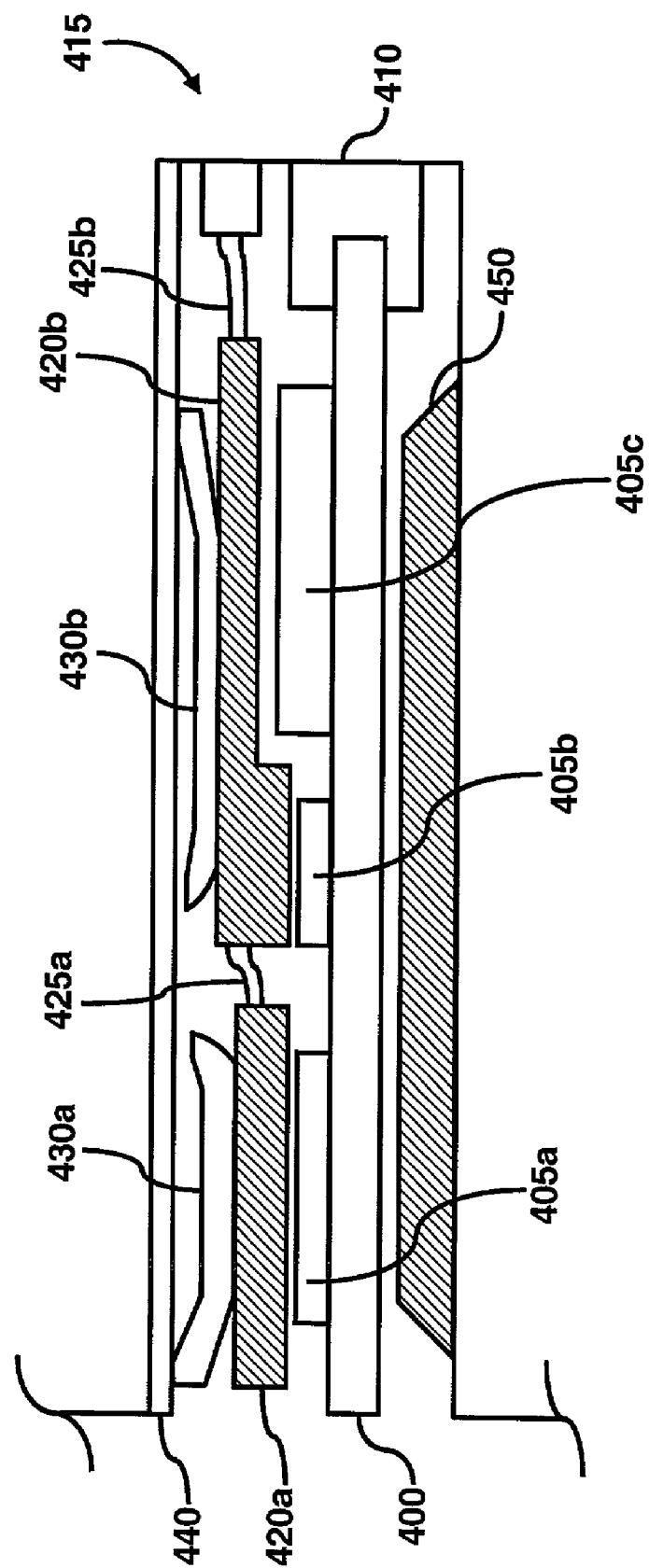
FIG. 4 illustrates a cross-sectional view of one embodiment of part of the system.

FIG. 4 depicts a cross-sectional view of one embodiment of part of the system 300. In FIG. 4, a computer board 400 is shown with a variety of computer components 405*a*, 405*b*, and 405*c* mounted thereto. The computer board 400 engages a connection 410 that provides electrical connectivity between the system and the computer board 400. An actuated thermal cell is provided and includes a series of cold plates 420*a* and 420*b*. The cold plates 420*a* and 420*b* are connected by tubing 425*a* and 425*b* to a liquid traveling through the system, as previously described. In a one embodiment, the tubing is relatively flexible, so as to allow for movement of the cold plates 420a and 420b relative to the system. Each of the cold plates 420a and 420b is connected to a spring 430a and 430b. The springs 430a and 430b are also connected to a positioning mechanism (not shown) that may be part of the actuated thermal cell 415.

In its simplest form, the positioning mechanism may be a plate 440 to which the springs 430a and 430b for the cold plates 420a and 420b are attached. In another form the positioning mechanism is a metal frame. The positioning mechanism may be similar to that described in U.S. patent application titled "Mechanically Activated Thermal Connector for Cooling Electronics" having Ser. No. 10/0123,227 filed Dec. 14, 2001 or that described in U.S. patent application titled "Thermal Connection Layer" having Ser. No. 10/022,112 also filed Dec. 14, 2001, the teachings of which are incorporated herein by reference. The positioning mechanism facilitates vertical movement of the springs 430a and 430b, as well as the cold plates 420a and 420b to which the springs 430a and 430b are attached. The positioning mechanism may lower the springs 430a and 430b and the cold plates 420a and 420b so that the cold plates 420a and 420b are in direct contact with the variety of computer components 405a, 405b, and 405c mounted to the computer board 400. This allows the cold plates 420a and 420b to transfer heat away from the variety of computer components 405a, 405b, and 405c to the liquid traveling through the system. A heat sink 450, may also be provided to facilitate even greater heat dissipation away from the computer board 400 and the variety of computer components 405a, 405b, and 405c mounted thereto. Alternatively, the heat sink 450 may be another cold plate such as the cold plates 420a and 420b.

It should be appreciated that a variety of cold plates 420a and 420b may be used and that the cold plates 420a and 420b may take on a variety of shapes and configurations to match the variety of computer components 405a, 405b, and 405c provided on the computer board 400. The cold plates 420a and 420b may be constructed from metal, ceramic, or another material with a relatively high thermal conductivity. The cold plates 420a and 420b include an internal channel so that the liquid traveling through the system may pass through the cold plates 420a and 420b. This channel may be configured to provide a relatively large surface area for the liquid to contact so as to maximize the transfer of heat from the variety of computer components 405a, 405b, and 405c to the cold plates 420a and 420b and on to the liquid traveling through the system.

Figure 5:
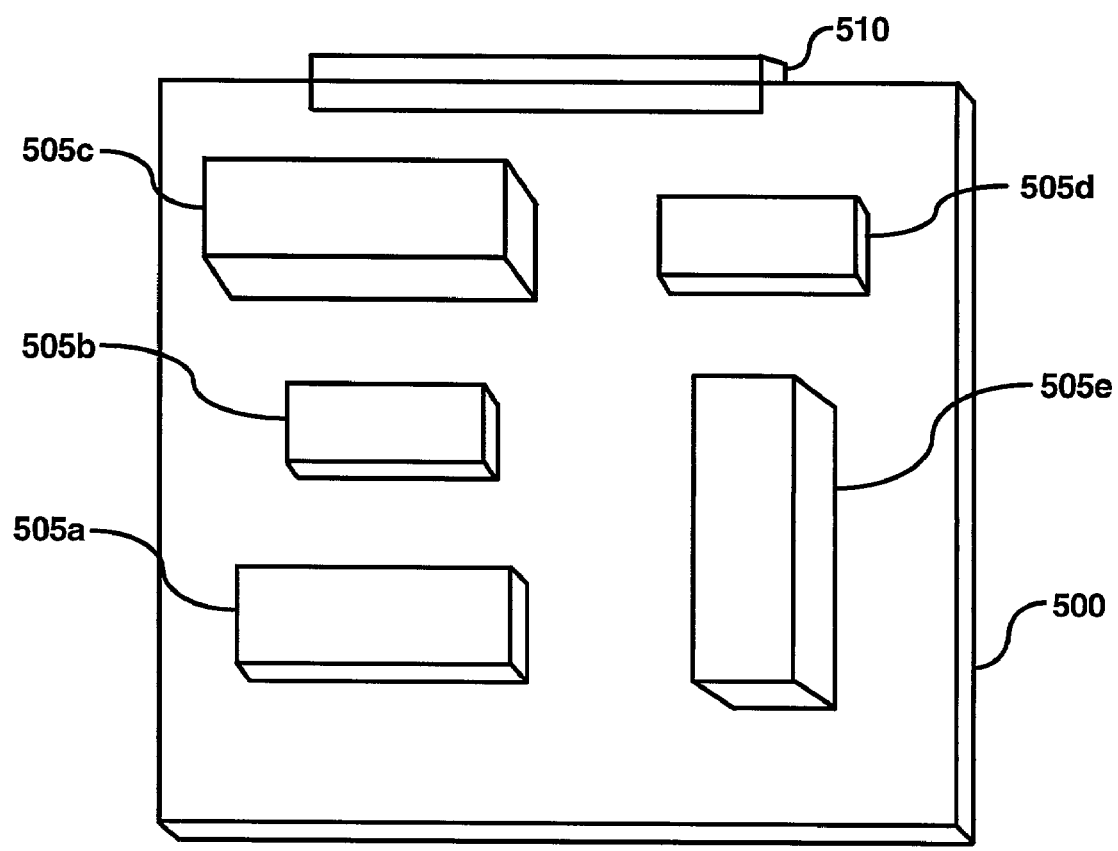
FIG. 5 depicts a computer board for use in accordance with certain embodiments of the invention.

FIG. 5 depicts a computer board 500 similar to that depicted in FIGS. 3 and 4. The computer board 500 includes a variety of components 505a, 505b, 505c, 505d, and 505e attached thereto. As previously described, the components 505a, 505b, 505c, 505d, and 505e may include one or more processors, microprocessors, network chips, power converters, memory blocks, memory controllers, central processing units, or a variety of other components. In one embodiment, at least one of the components 505a, 505b, 505c, 505d, and 505e includes a sensing device for measuring and reporting the power consumption of the computer board 500. In such an embodiment, the sensing device enables the computer board 500 itself to report its power consumption, which information may be used by a controller in the system (not shown) to modulate the cooling operation of the system. A connector 510 is also provided, to permit electrical communication with the connection of the system. This connector 510 may also supply power to the computer board 500.

Figure 6:
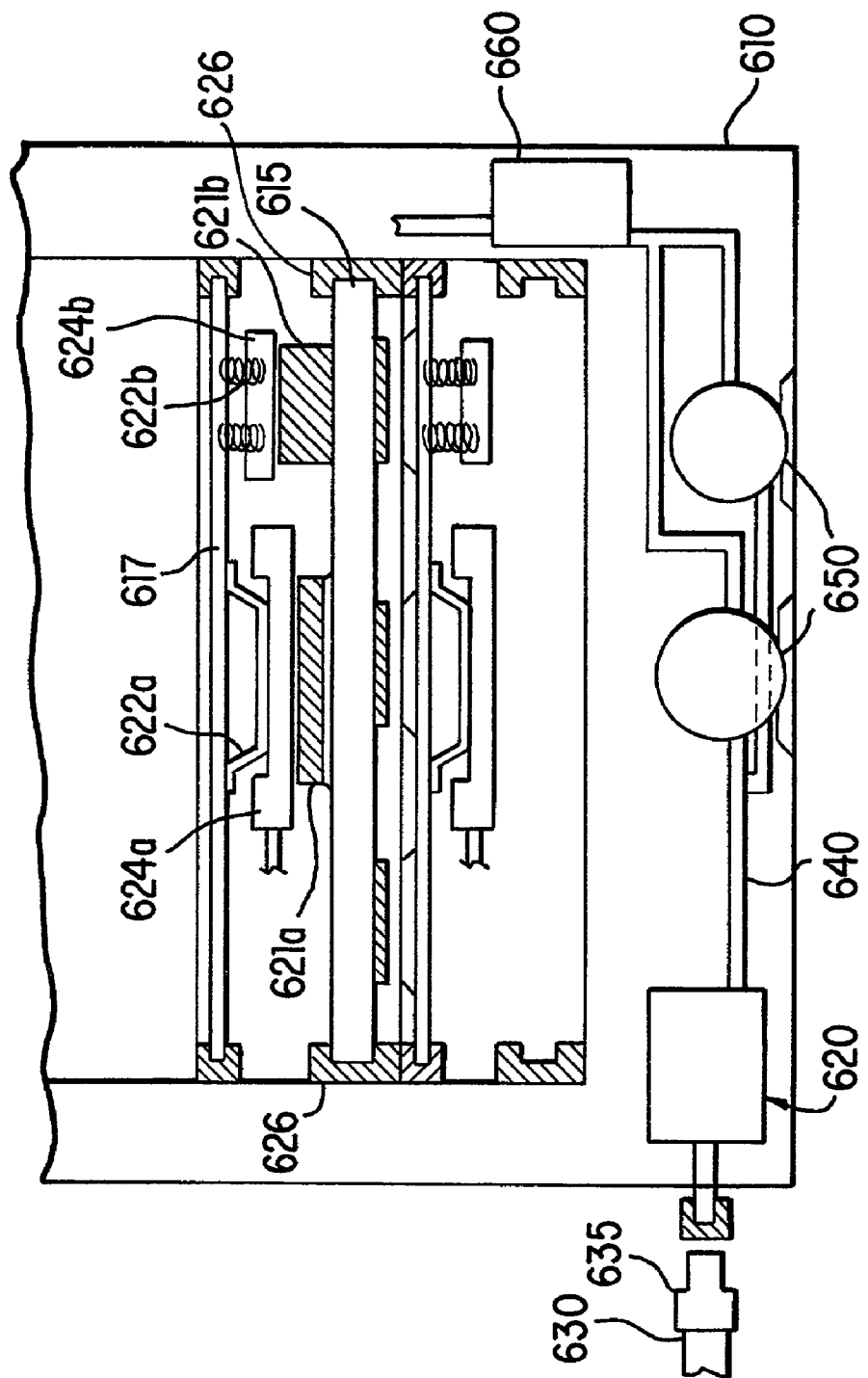
FIG. 6 shows a lateral cross-sectional view of part of a system in accordance with one embodiment of the invention.

FIG. 6 shows a lateral cross-sectional view of part of a system in accordance with one embodiment of the invention. In FIG. 6, a housing 610 shields the system's internal components from the environment and also provides a structure or framework within which to mount the variety of components that may be used with or are otherwise part of the system. A computer board 615 is rack mounted within the system. An actuated thermal cell 617 is provided for cooling components 621a and 621b mounted to the computer board 615. The actuated thermal cell 617 may be similar to that shown in FIG. 4, and may include springs 622a and 622b mounted to cold plates 624a and 624b. Multiple boards such as computer board 615 may be mounted within the system using for instance, mounting mechanisms 626a and 626b. The computer board 615 may be in contact with electronic connections (not shown) provided within the system, as are commonly known in the art. In one embodiment, these electronic connections may incorporate, or may otherwise be monitored by, a sensing device such that the power consumption of each computer board 615 may be measured and reported back to a controller (not shown).

A liquid to liquid heat exchanger 620 is shown in thermal communication with a liquid which travels throughout the system as well as the chilled water supply 630. A valve 635 may be provided to control the flow of chilled water from the chilled water supply 630. The valve 635 may be a smart-valve, as previously described, and works in concert with a controller (not shown) so that the overall cooling of the system is managed, and the system is neither over or under cooled thereby the system is one that may be optimized for efficient cooling.

A supply line 640 carries the liquid which travels to the system from the liquid to liquid heat exchanger 620. In one embodiment the liquid may travel directly from the liquid heat exchanger 620 to the actuated thermal cells 617 provided to cool the computer boards 615. From the actuated thermal cells 617, the liquid travels to the reservoir 660 and on to one or more pumps 650. These pumps 650 push the water into the liquid to liquid heat exchanger 620 system.

Figure 7:
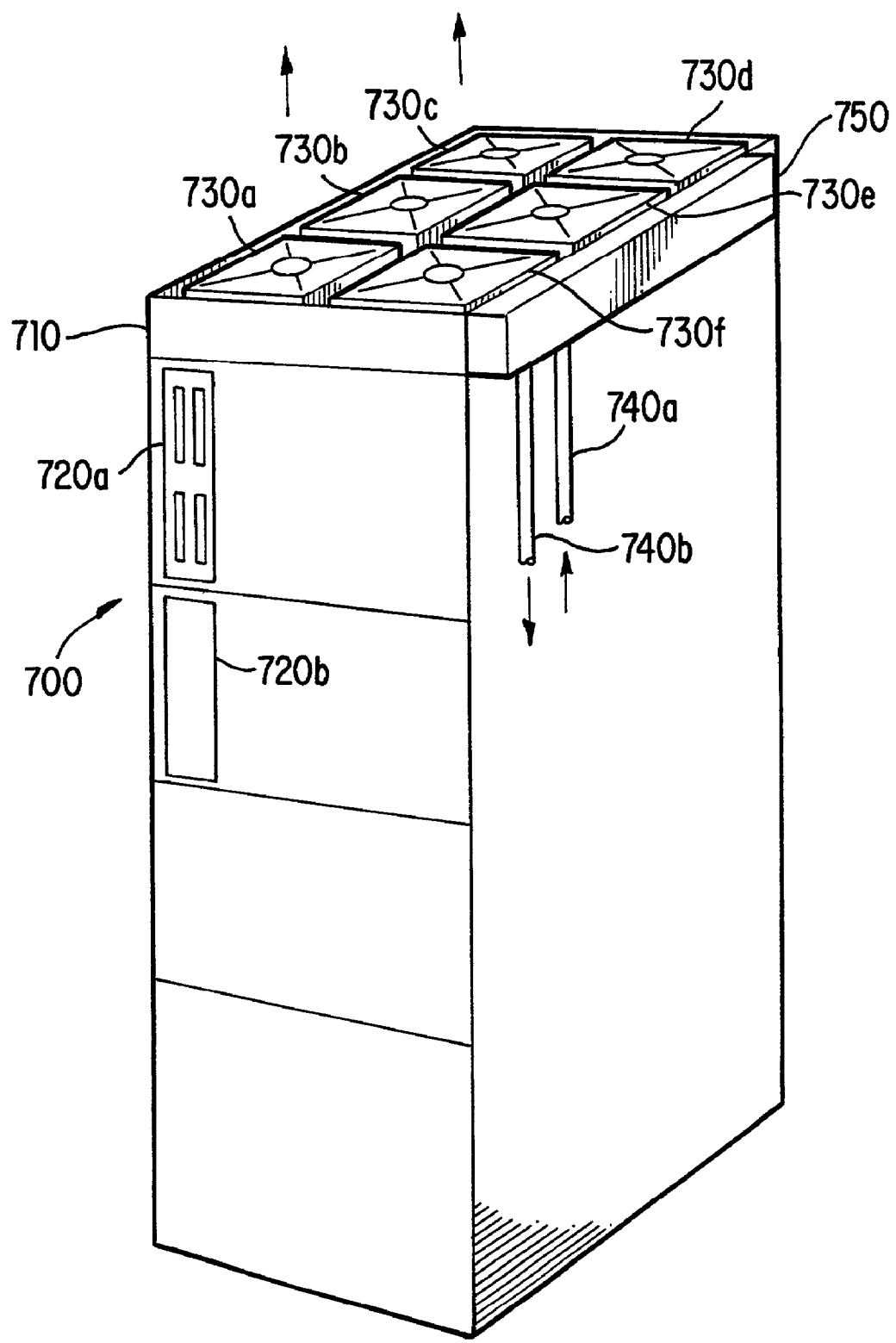
FIG. 7 shows a perspective view of another embodiment of the present invention.

FIG. 7 shows a perspective view of another embodiment of the present invention. In the embodiment shown, a liquid to air heat exchanger 710 is provided instead of the liquid to liquid heat exchangers of prior embodiments. Actuated thermal cells 720a and 720b, similar to those depicted in other drawings, may be installed within the storage and cooling system 700. As may be appreciated from FIG. 7, the actuated thermal cells 720a and 720b may be racked vertically within the system 700.

In the storage and cooling system 700 depicted in FIG. 7 a plurality of fans 730a–f are provided for cooling the liquid circulating through the storage and cooling system 700. The fans 730a–f may be relatively high velocity fans to provide adequate cooling of the liquid circulating through the storage and cooling system 700. A supply line 740a and 740b provides for the liquid circulating through the system to reach the cooling area provided by the liquid to air heat exchanger 710. The liquid to air heat exchanger 710 usually comprises one or more coils (not shown) and in some embodiments a plurality of fins (not shown). Air is then forced across the fins of the coils using an electric fan, such as the fans 730a–f shown in FIG. 7 to facilitate the absorption of heat from the coils to the surrounding air. In the storage and cooling system 700 relatively warm liquid is provided to the liquid to air heat exchanger 710 through supply line 740a and returns from the liquid to air heat exchanger 710 through supply line 740b.

One embodiment of the storage and cooling system 700 is provided with venting so that air warmed through the liquid to air heat exchanger 710 may be carried away from the storage and cooling system 700.

Figure 8:
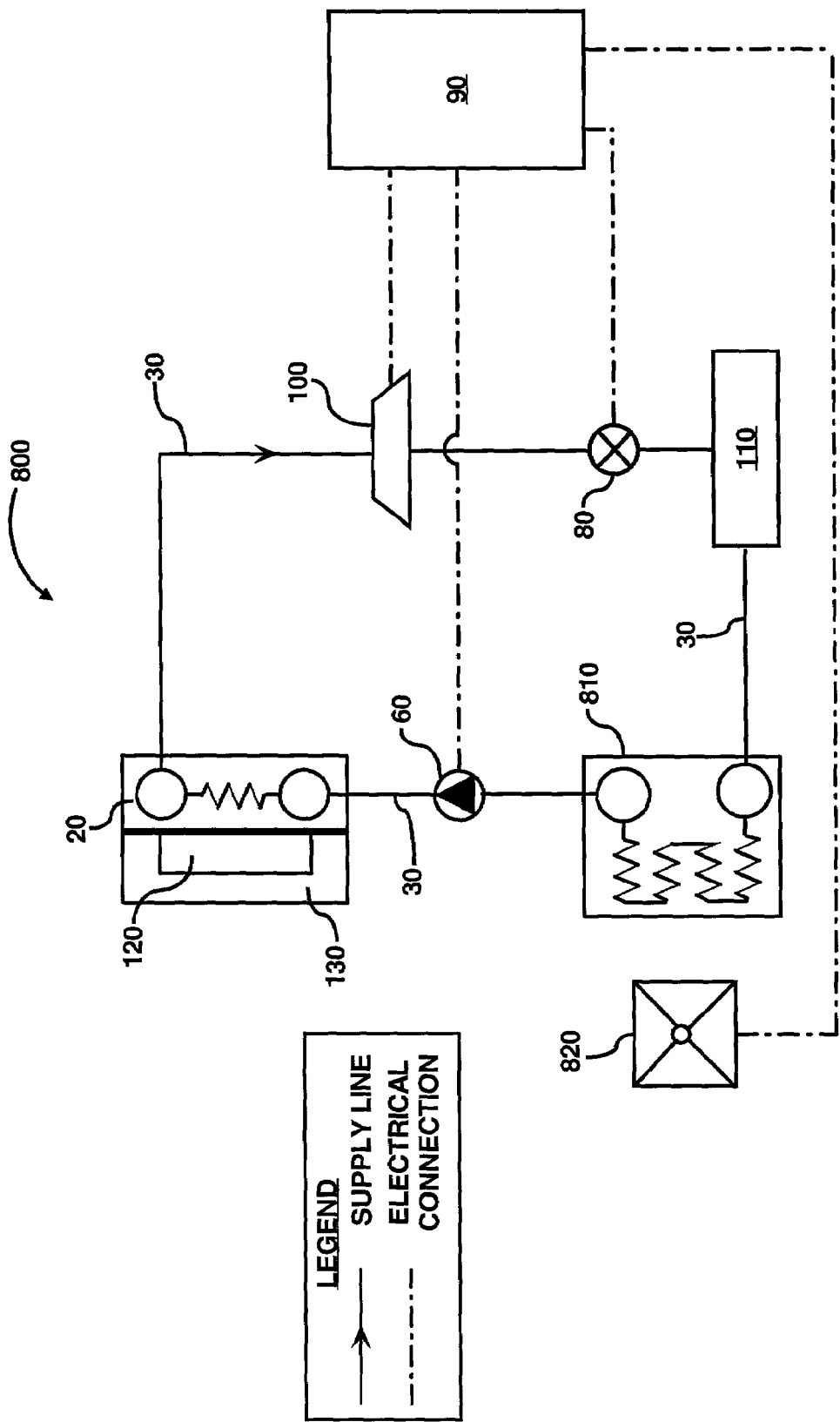
FIG. 8 depicts a schematic view of an embodiment of the invention similar to that depicted in FIG. 7.

FIG. 8 depicts a schematic view of an embodiment of the invention similar to that depicted in FIG. 7. In FIG. 8, a cooling system 800 is shown. In certain respects, the cooling system 800 is similar to that depicted in FIG. 1. The cooling system 800 employs a liquid to air heat exchanger 810 instead of the liquid to liquid heat exchanger of FIG. 1. As described with reference to FIG. 7, the liquid to air heat exchanger 810 comprises one or more coils through which the liquid travels. A fan 820, in one embodiment, a relatively high-velocity fan, is provided to blow air across and around the coils, so that liquid traveling through the coils is cooled. In one embodiment, the fan 820 is in electrical communication with controller 90, so that the fan's speed may be increased or decreased or the fan may be turned on or off completely in accordance with the cooling system's 800 cooling needs, so as to optimize the cooling and efficiently operate the cooling system 800.

It is to be appreciated that the cooling system 800 may employ a plurality of fans. The cooling system 800, is usually configured with a plurality of cold plates 20 for use with a plurality of computer boards 130 similar to the embodiment shown in FIG. 2.

In yet another embodiment of the invention, a method for cooling at least one computer component is provided. The method may include the step of providing a housing to receive computer components. This step would entail providing a housing that can support removable computer components. Another step of the method would include providing at least one cold plate within the housing to absorb heat from at least one computer component, wherein the cold plate is configured to allow fluid to pass through the cold plate. The method may also include the step of circulating a fluid within the housing and through the cold plate and then away from the cold plate such that heat is absorbed from the cold plate into the fluid.

In other embodiments of the method, a variety of other steps may be employed. For instance, in one embodiment, the step of circulating the fluid through a heat exchanger such that the heat exchanger operates to absorb heat from the fluid and transfer the heat into the medium. In another embodiment, an additional step involves using one or more valves to modulate the fluid circulation within the system. Additional steps of still other embodiments, may include monitoring either or both of the temperature and power consumption within the system, and with respect to monitoring the power consumption, particular monitoring may be conducted for one or more of the computer boards, and/or individual computer components. In yet another embodiment, the method includes modulating the circulation of the fluid through the system, in response to a monitoring step, to include the aforementioned monitoring steps. The method may also include modulating the operation of the heat exchanger in response to a monitoring step.

In another embodiment, the method further includes the steps of detecting the number of the one or more computer components operating within the system. The method may also include modulating the cooling of the system in response to the step of detecting the number of the one or more computer components operating within the system.

While the invention has been described with reference to certain exemplary embodiments thereof, those skilled in the art may make various modifications to the described embodiments of the invention without departing from the true spirit and scope of the invention, to include combining the disclosed elements and steps in various forms. The terms and descriptions used herein are set forth by way of illustration only and not meant as limitations. In particular, although the present invention has been described by examples, a variety of devices would practice the inventive concepts described herein. Although the invention has been described and disclosed in various terms and certain embodiments, the scope of the invention is not intended to be, nor should it be deemed to be, limited thereby and such other modifications or embodiments as may be suggested by the teachings herein are particularly reserved, especially as they fall within the breadth and scope of the claims here appended. Those skilled in the art will recognize that these and other variations are possible within the spirit and scope of the invention as defined in the following claims and their equivalents.

What is claimed is:

1. A system for cooling at least one computer component, said system comprising:
   a plurality of cold plates adapted to transfer heat from a plurality of computer components to a cooling fluid, wherein the cooling fluid flows through respective interiors of the plurality of cold plates;
   a supply line to supply said cooling fluid into, and out from, said plurality of cold plates;
   a heat exchanger adapted to transfer heat from the cooling fluid to a medium, to thereby cool the cooling fluid;
   a chilled medium supply, wherein the heat exchanger is configured to receive chilled medium from the chilled medium supply; and
   a controllable valve configured to modulate the supply of medium from the chilled medium supply to thereby vary the transfer of heat from the cooling fluid to the chilled medium.

2. The system of claim 1, further comprising:
   a plurality of controllable valves positioned along the supply line to control the flow of cooling fluid into each of the plurality of cold plates.

3. The system of claim 1, further comprising:
   an electronic controller configured to control the supply of cooling fluid into each of the plurality of cold plates.

4. The system of claim 3, wherein said electronic controller is configured to modulate the cooling of at least one of said computer components based upon the cooling fluid supplied to each of the plurality of cold plates.

5. The system of claim 1, wherein said controllable valve is adapted to modulate a supply of medium from the chilled medium supply in response to instructions from an electronic controller.

6. The system of claim 3, further comprising:
   a plurality of controllable valves positioned along the supply line to control the flow of cooling fluid into the plurality of cold plates;
   wherein the electronic controller is configured to operate the plurality of controllable valves to control the supply of cooling fluid into each of the plurality of cold plates.

7. The system of claim 1, further comprising:
   a fluid reservoir attached to said supply line; and
   one or more pumps operable to circulate the fluid.

8. The system of claim 3, further comprising:
   a temperature gauge for detecting temperature of at least one of the cooling fluid, a cold plate, and the at least one computer component, and wherein the electronic controller is configured to control the supply of cooling fluid into each of the plurality of cold plates based upon the temperature detected by the temperature gauge.

9. The system of claim 3, further comprising:
a sensor configured to measure the power consumption of the at least one computer component; and
wherein the electronic controller is configured to control the supply of cooling fluid into each of the plurality of cold plates based upon the power consumption of the at least one computer component measured by the sensor.

10. A system for cooling a plurality of computer components, said system comprising:
a plurality of means for absorbing heat from the plurality of computer components;
means for holding the plurality of computer components in thermal attachment with the plurality of means for absorbing heat;
means for supplying cooling fluid into the plurality of means for absorbing heat, wherein the means for supplying cooling fluid is configured to variably supply cooling fluid into the plurality of means fur absorbing heat;
means for cooling the cooling fluid, said means for cooling including a chilled medium; and
means for modulating a supply of the chilled medium, wherein the means for modulating is configured to vary the transfer of heat from the cooling fluid to the chilled medium.

11. The system of claim 10, wherein said means for supplying cooling fluid further comprises means for controlling the amount of cooling fluid supplied to each of the plurality of means for absorbing heat.

12. The system of claim 11, further comprising:
means for electronically controlling the means for controlling the amount of cooling fluid supplied to each of the plurality of means for absorbing heat.

13. The system of claim 10, further comprising:
means for monitoring temperature.

14. The system of claim 10, further comprising:
means for monitoring power consumption of the plurality of computer components.

15. A method for cooling at least one computer component, said at least one computer component being thermally attached to a cold plate, said method comprising:
supplying cooling fluid into the cold plate from a supply line for supplying cooling fluid into a plurality of cold plates;
varying the amount of cooling fluid supplied into the cold plate based upon at least one detected condition; and
circulating the cooling fluid through the cold plate and out of the cold plate such that heat is absorbed from the at least one computer component into the cooling fluid circulating in the cold plate;
circulating the cooling fluid through a heat exchanger such that the heat exchanger absorbs heat from the cooling fluid to thereby cool the cooling fluid; and
modulating the operation of the heat exchanger to vary a supply of a medium configured to absorb heat from the cooling fluid to thereby vary a level of heat exchange between the cooling fluid and the heat exchanger.

16. The method of claim 15, wherein the step of varying the amount of cooling fluid supplied into to cold plate further comprises using one or more valves to vary the amount of cooling fluid supplied to the cold plate.

17. The method of claim 15, further comprising monitoring a temperature of at least one of the cooling fluid, to cold plate, and the at least one computer component; and
wherein the step of varying the amount of cooling fluid supplied into the cold plate further comprises varying the amount of cooling fluid supplied into the cold plate based upon the monitored temperature.

18. The method of claim 15, further comprising:
monitoring to power consumption of the at least one computer component; and
wherein the step of varying to amount of cooling fluid supplied into the cold plate further comprises varying the amount of cooling fluid supplied into the cold plate based upon the monitored power consumption.

19. The method of claim 15, further comprising anticipating a level of heat generation by the at least one computer component; and
wherein the step of varying the amount of cooling fluid supplied into the cold plate further comprises varying the amount of cooling fluid supplied into the cold plate based upon the anticipated heat generation level.

20. The method of claim 15, further comprising detecting the number of the at least one computer component;
monitoring the operation of the at least one computer component; and
wherein the step of varying the amount of cooling fluid supplied into the cold plate further comprises varying the amount of cooling fluid supplied into the cold plate based upon the monitored operation of the at least one computer component.

21. The method of claim 15, wherein the at least one computer component comprises a plurality of computer components thermally attached to a plurality of cold plates, said method further comprising:
supplying cooling fluid to each of the plurality of cold plates; and
individually varying the amount of cooling fluid supplied into each of the plurality of cold plates.

22. The method of claim 21, wherein the step of individually varying the amount of cooling fluid supplied further comprises manipulating a plurality of valves positioned along the supply line to individually vary the amount of cooling fluid supplied to each of the plurality of cold plates.

* * * * *

UNITED STATES PATENT AND TRADEMARK OFFICE
CERTIFICATE OF CORRECTION

| | | |
|---|---|---|
| PATENT NO. | : 7,024,573 B2 | Page 1 of 1 |
| APPLICATION NO. | : 10/062443 | |
| DATED | : April 4, 2006 | |
| INVENTOR(S) | : Chandrakant D. Patel et al. | |

It is certified that error appears in the above-identified patent and that said Letters Patent is hereby corrected as shown below:

In column 13, line 18, in Claim 10, delete "fur" and insert -- for --, therefor.

In column 14, line 6, in Claim 16, delete "to" and insert -- the --, therefor.

In column 14, line 10, in Claim 17, delete "to" and insert -- the --, therefor.

In column 14, line 17, in Claim 18, delete "to" and insert -- the --, therefor.

In column 14, line 19, in Claim 18, delete "to" and insert -- the --, therefor.

Signed and Sealed this

First Day of September, 2009

David J. Kappos
*Director of the United States Patent and Trademark Office*